United States Patent
Gupta

(10) Patent No.: US 9,190,982 B2
(45) Date of Patent: Nov. 17, 2015

(54) RF MIXER FILTER MEMS RESONATOR ARRAY

(71) Applicant: TEXAS INSTRUMENTS INCORPORATED, Dallas, TX (US)

(72) Inventor: Arun Kumar Gupta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 99 days.

(21) Appl. No.: 13/646,371

(22) Filed: Oct. 5, 2012

(65) Prior Publication Data

US 2013/0207746 A1 Aug. 15, 2013

Related U.S. Application Data

(60) Provisional application No. 61/543,559, filed on Oct. 5, 2011.

(51) Int. Cl.
*H03H 9/46* (2006.01)
*H05K 13/00* (2006.01)

(52) U.S. Cl.
CPC ............... *H03H 9/462* (2013.01); *H05K 13/00* (2013.01); *Y10T 29/49117* (2015.01)

(58) Field of Classification Search
CPC ............................ H03H 9/02244; H03H 9/462
USPC .......................................................... 333/186
See application file for complete search history.

(56) References Cited

U.S. PATENT DOCUMENTS

| | | | | |
|---|---|---|---|---|
| 7,868,829 B1 * | 1/2011 | Colburn et al. | ........ | 343/700 MS |
| 8,354,975 B2 * | 1/2013 | Ando et al. | .................... | 343/913 |
| 8,436,785 B1 * | 5/2013 | Lai et al. | ....................... | 343/909 |

OTHER PUBLICATIONS

Wong, Ark-Chew et al., Micromechanical Mixer+Filters, Technical Digest, IEEE International Electron Devices Meeting, San Francisco, CA Dec. 6-9, 1998, pp. 471-474.
Pourkamali, Siavash, Ayazi, Farrokh, Electrically coupled MEMS bandpass filters Part II. without coupling element, www.sciencedirect.com, 2005 Elsevier B.V., pp. 317-325.

* cited by examiner

*Primary Examiner* — Stephen E Jones
*Assistant Examiner* — Scott S Outten
(74) *Attorney, Agent, or Firm* — Jacqueline J. Garner; Frank D. Cimino

(57) ABSTRACT

A MEMS mixer filter including an array of a multiplicity of resonator elements with conductive outer surfaces in a coplanar rectangularly tiled array, and two sets of DC bias lines in which alternating resonator elements in each row and column are connected to one or the other sets of bias lines so that laterally adjacent resonators may be biased to a DC potential. The resonator elements are uniform in size and shape. Lateral dimensions of the resonator elements are between 5 and 50 microns. The resonator elements are between 100 nanometers and 100 microns thick, and adjacent resonator elements are separated by a gap between 100 and 500 nanometers. A process of forming the MEMS mixer filter.

21 Claims, 4 Drawing Sheets

RF MIXER FILTER MEMS RESONATOR ARRAY

This application claims the benefit of Provisional Application No. 61/543,559, filed Oct. 5, 2011, the entirety of which is hereby incorporated by reference.

BACKGROUND

This relates to the field of integrated circuits and, in particular, to microelectromechanical system (MEMS) resonators in integrated circuits.

Microelectromechanical system (MEMS) resonators are solid elements whose mechanical vibrations are detected by sensor circuits. MEMS resonators may be used in heterodyne receiver architectures as mixer filters. Impedance matching the MEMS resonators with typical transmission lines in radio frequency (RF) circuits has been problematic, due to low values of electrostatic coupling between the MEMS oscillators and the sensor circuits. Attempts to increase the capacitance have reduced linearity and power capacity.

SUMMARY

A MEMS mixer filter may be formed of a multiplicity (for example, 1,000 or more) of MEMS resonator elements disposed in an array in which laterally adjacent resonator elements are biased to a static electric potential difference. The array may be, for example, a rectangular tiled array. A modulated electrical RF input signal may be applied to the resonator elements biased to one side of the static electric potential difference. An electrical local oscillator signal may be applied to the resonator elements biased to the other side of the static electric potential difference, such that a difference between the local oscillator frequency and the RF carrier wave frequency is within a resonance band of a primary lateral contour vibration mode of the resonator elements. A down-converted signal with a frequency equal to a difference between the local oscillator frequency and the RF carrier wave frequency may be provided.

DETAILED DESCRIPTION OF EXAMPLE EMBODIMENTS

An example embodiment of a MEMS mixer filter may be formed with a multiplicity of MEMS resonator elements in a rectangular tiled array. Direct current (DC) bias lines are formed in the mixer filter so that laterally adjacent resonator elements may be biased to a static electric potential difference. A modulated electrical RF input signal on an RF carrier wave may be applied to the resonator elements biased to one side of the static electric potential difference. An electrical local oscillator signal is applied to the resonator elements biased to the other side of the static electric potential difference, such that a difference between the local oscillator frequency and the RF carrier wave frequency is within a resonance band of a primary lateral contour vibration mode of the resonator elements. A down-converted signal with a frequency equal to a difference between the local oscillator frequency and the RF carrier wave frequency is provided on the DC bias lines.

An impedance of a MEMS mixer filter is a ratio of an output signal current amplitude to an input signal voltage amplitude. The output signal current is at a frequency that is within the resonance band of the primary lateral contour vibration mode of the resonator elements.

Figure 1A:
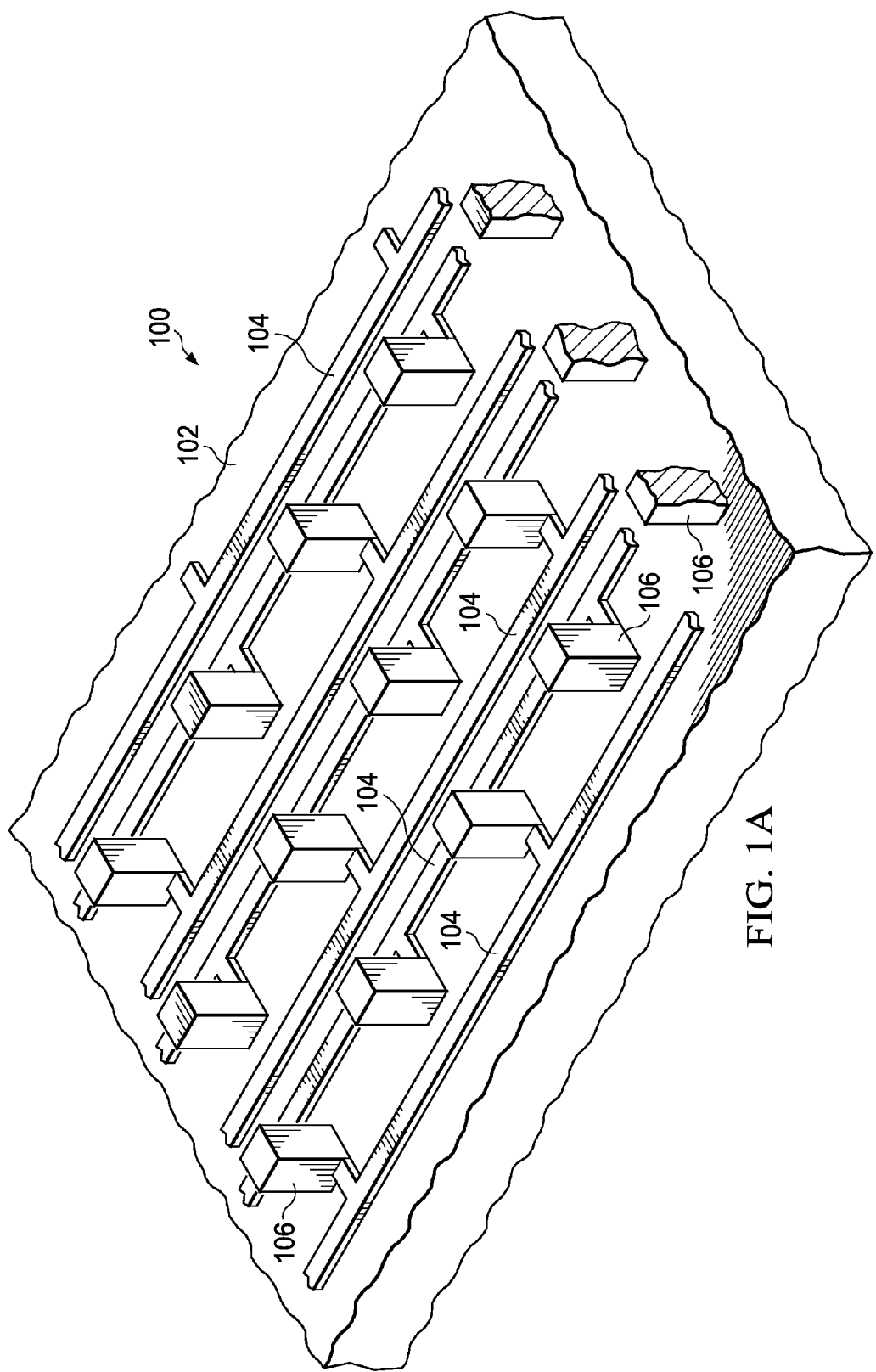
FIGS. 1A and 1B are perspective views of a MEMS mixer filter according to an embodiment illustrating principles of the invention.
Figure 1B:
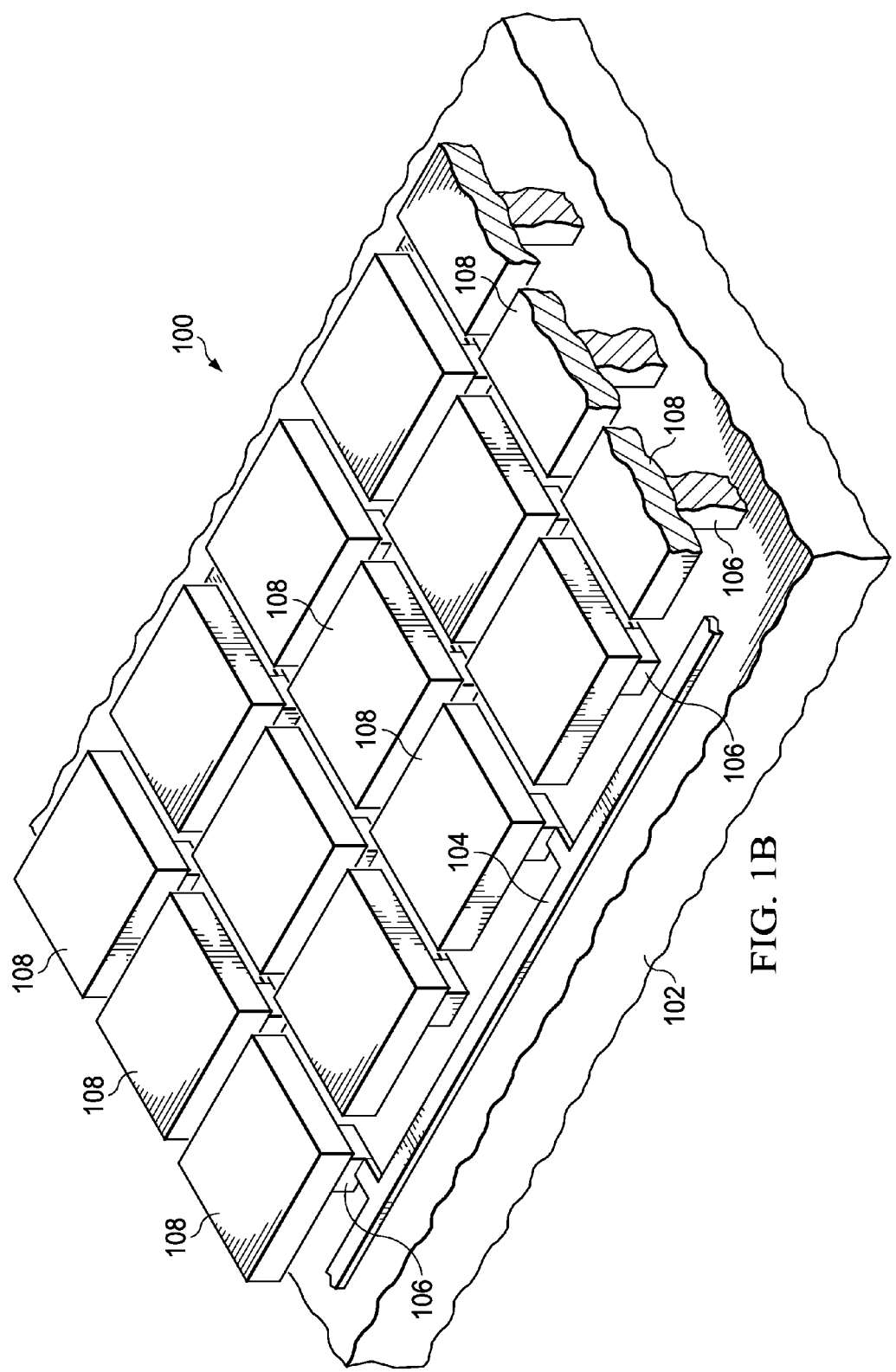

FIGS. 1A and 1B illustrate a mixer filter 100 formed on a substrate 102 which may be an integrated circuit or may be a material such as single crystal silicon, sapphire, glass, or other material suitable for formation of the mixer filter 100. The substrate includes DC bias lines 104 of electrically conductive material such as copper or aluminum which provide electrical potentials. The DC bias lines 104 are attached to the substrate 102; the DC bias lines 104 may be located at a top surface of the substrate 1002 or may be formed under the top surface, for example as interconnects in an integrated circuit. Primary supports 106 are formed on the top surface of the substrate 1002, so that a primary support 106 is provided for each subsequently formed resonator element. The primary supports 106 may include metal such as aluminum, nickel, copper or tungsten, possibly with a liner metal such as titanium nitride, or may include polycrystalline silicon (commonly referred to as polysilicon or "poly") or single crystal silicon. The primary supports 106 may also include one or more dielectric materials such as silicon dioxide, silicon nitride or polyimide. Each primary support 106 includes an electrically conductive element, which may be the primary support 106 itself, which is electrically connected to exactly one of the DC bias lines 104 so that an electric potential on the DC bias line 104 is provided to the subsequently formed resonator on the primary support 106. In one version of the instant embodiment, the primary supports 106 may be between 0.1 and 2 microns high.

Referring to FIG. 1B, the example embodiment has at least 1000 resonator elements 108 formed on the primary supports 106, one resonator element 108 per primary support 106 and one primary support 106 per resonator element 108. Each resonator element 108 is connected to the corresponding primary support 106 at a nodal point of a desired lateral contour vibration mode of the resonator element 108. In one version of the instant embodiment, each primary support 106 is attached to a center of a bottom surface of the corresponding resonator element 108. The resonator elements 108 are configured in a rectangular tiled array as shown in FIG. 1B, in which each resonator element 108 in an interior of the array is adjacent to four other resonator elements 108. The resonator elements 108 are uniform in size and shape to within manufacturing tolerances used to fabricate the mixer filter 100. A length and a width of the resonator elements 108 may be between 5 and 50 microns. In one version of the instant embodiment, the resonator elements 108 the length may equal the width. In one version of the instant embodiment, the resonator elements 108 the length and the width may be equal and between 9 and 11 microns. A thickness of the resonator elements 1008 may be between 100 nanometers and 100 microns. In one version of the instant embodiment, an average frequency of a primary lateral contour vibration mode of the resonator elements 108 is between 50 megahertz (MHz) and 500 MHz.

Adjacent resonator elements 108 are separated by gaps. In one version of the instant embodiment, the resonator elements 108 may be between 200 and 500 nanometers thick, separated by gaps between 100 and 500 nanometers wide. In another version of the instant embodiment, the resonator elements 108 may be between 1 and 5 microns thick, separated by gaps between 500 nanometers and 2 microns wide. In a further version, the resonator elements 108 may be between 20 and 100 microns thick, separated by gaps between 1 and 10 microns wide. The resonator elements 108 are substantially coplanar, so that top surfaces of adjacent resonator elements 1008 are aligned within 10 percent of the thickness of the resonator elements 108. The resonator elements 108 are formed of solid material and may include aluminum, nickel, copper, polycrystalline silicon, single crystal silicon, silicon dioxide, aluminum oxide, not excluding a perforated configuration, such that a primary lateral contour vibration mode of the resonator elements 108 is within a signal band of interest of the mixer filter 100. An outer surface of the resonator elements 108 is electrically conductive with a resistivity less than 100 ohm-cm, so that adjacent resonator elements 108 are capacitively coupled across the gaps separating the adjacent resonator elements 108. The conductive outer surface of the resonator elements 108 is electrically connected to the electrically conductive element of the primary support 106 under the resonator elements 108.

In one version of the instant embodiment, the primary supports 106 may be formed concurrently with a layer of resonator material for the resonator elements 1008. For example, a sacrificial layer of photosensitive polymer such as photoresist or polyimide may be formed on the substrate 102 with openings in areas defined for the primary supports 106. Subsequently, a conformal layer of metal may be formed on the sacrificial layer and in the openings. The metal in the openings provides the primary supports 106. The metal on a top surface of the sacrificial layer may be patterned to form the resonator elements 108. The sacrificial layer may be subsequently removed, for example by exposing the mixer filter 100 to an ambient containing ozone or oxygen radicals.

Additional supports, not shown, may be formed to improve mechanical integrity of the array of resonator elements 108. For example, electrically insulating connecting elements, not shown, may be formed at corners of the resonator elements 108 to improve coplanarity of the resonator elements 108.

Figure 2:
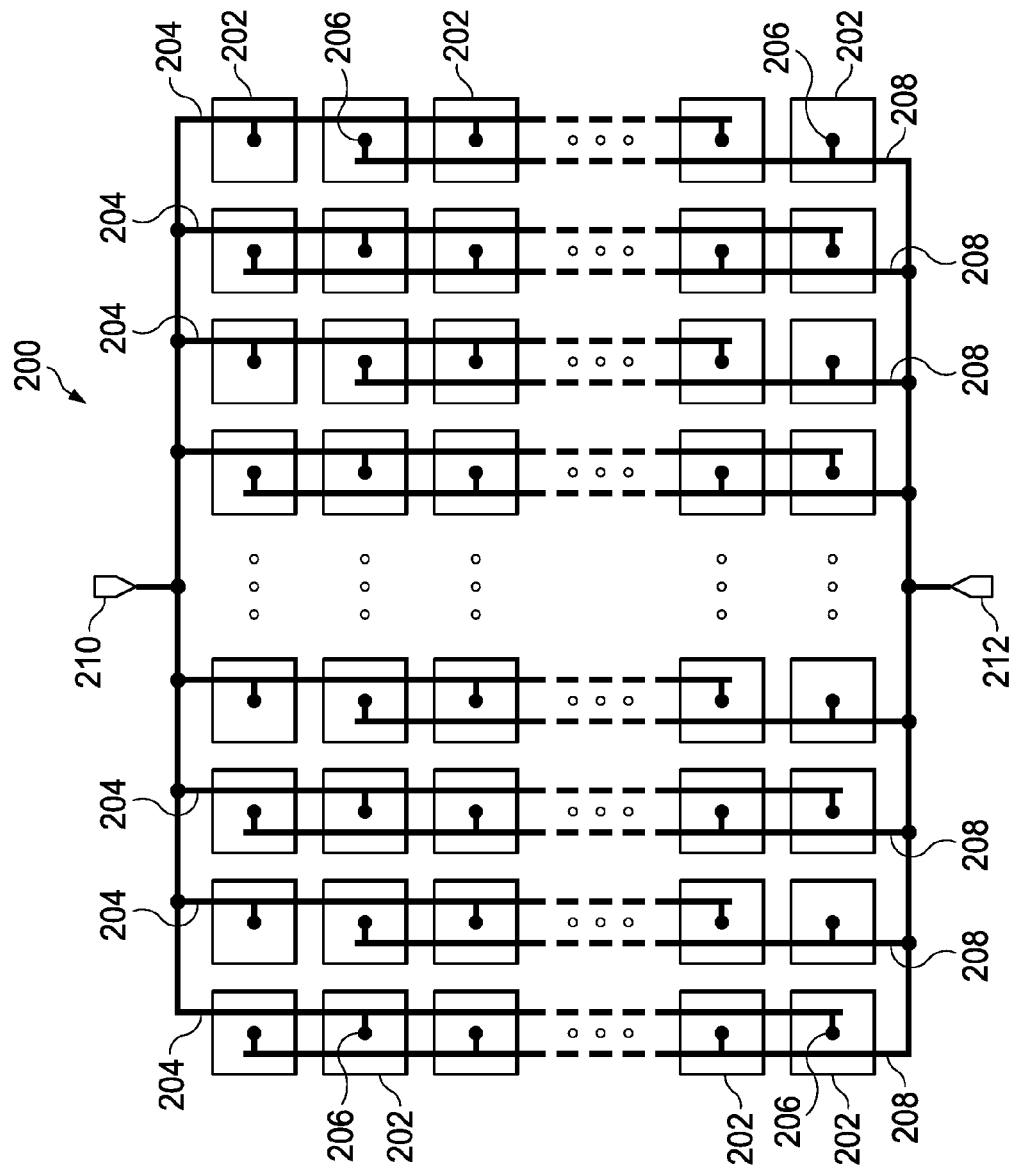
FIG. 2 is a top view of a mixer filter containing an array of resonator elements depicting a connection configuration of the DC bias lines.

FIG. 2 illustrates a mixer filter containing an array 200 of resonator elements depicting a connection configuration of the DC bias lines. The array 200 of resonator elements 202 is configured in a rectangular tiled array as described in reference to FIG. 1B. A first set of DC bias lines 204 is electrically connected, as described in reference to FIGS. 1A and 1B, to alternating resonator elements 202 in each row and column of the array 200, schematically depicted in FIG. 2 by connectors 206. A second set of DC bias lines 208 is connected to alternating resonator elements 202 in each row and column of the array 200 which are not connected to the first set of DC bias lines 204. The first set of DC bias lines 204 is connected to a first bias node 210, which may be on a substrate on which the array 200 of resonator elements 202 is formed, or may be located externally to the substrate. Similarly, the second set of DC bias lines 208 is connected to a second bias node 212, which may be on the substrate or may be located externally to the substrate. Resonator elements 202 at a periphery of the array 200 may be connected to other DC bias lines or may be unconnected to a DC bias line, a condition not shown in FIG. 2, for example to reduce edge effects during operation of the mixer filter.

Figure 3:
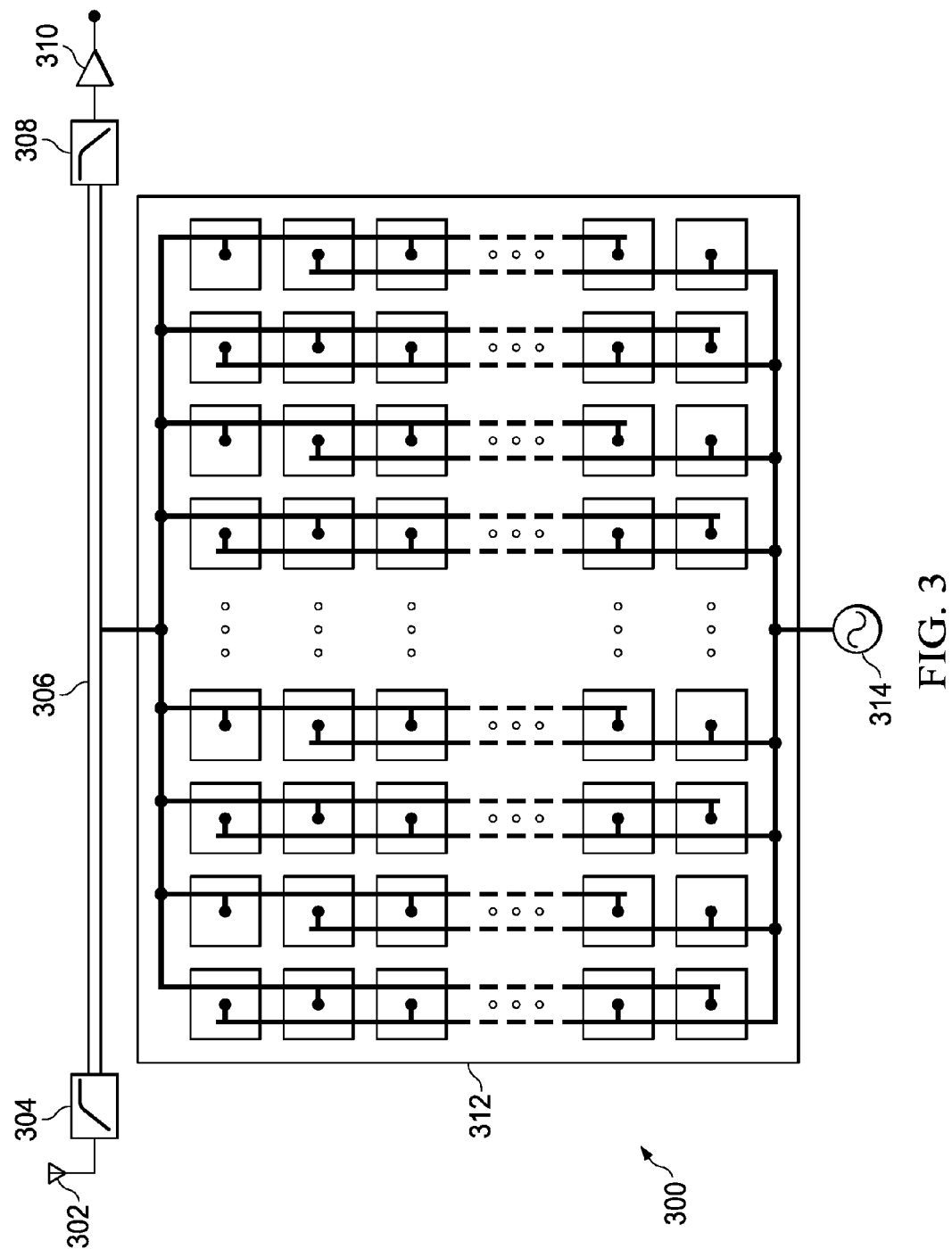
FIG. 3 depicts an example circuit containing a mixer filter.

FIG. 3 depicts an example circuit containing a mixer filter as described in reference to FIGS. 1A, 1B and 2. The circuit 300 includes an RF antenna 302 which is connected to an input of a high pass filter 304. An output of the high pass filter 304 is connected to an RF transmission line 306. The transmission line 306 is connected to an input of a low pass filter 308. An output of the low pass filter 308 is connected to an input of a low noise amplifier 310. A first bias node of the mixer filter 312 is connected to the RF transmission line 306, perhaps through a matching network, not shown. A second bias node of the mixer filter 312 is connected to a local oscillator 314.

During operation of the circuit 300, the RF antenna 302 provides an RF carrier wave modulated by an RF input signal to the input of the high pass filter 304. The high pass filter 304 is configured to pass the RF input signal and RF carrier wave with minimal distortion. The RF input signal and RF carrier wave, filtered by the high pass filter 304 are fed through the RF transmission line 306 and the first bias node into the mixer filter 312. The low pass filter 308 is configured to block the RF carrier wave from the input of the low noise amplifier 310. A DC potential bias is applied across the first and second bias nodes of the mixer filter 312. For example, in versions of the mixer filter 312 with gaps between resonator elements of 500 nanometers to 2 microns, the DC potential may be between 20 and 30 volts. The local oscillator 314 provides a reference signal to the second bias node. The reference signal frequency is adjusted so that a difference between the RF carrier wave frequency and the reference signal frequency is within a resonance band of a primary lateral contour vibration mode of the MEMS resonator elements. In one version of the instant embodiment, the mixer filter 3012 having 10,000 resonator elements with a lateral contour mode between 50 MHz and 500 MHz may have an impedance less than 2 kohms.

The DC potential bias may induce each resonator element in the mixer filter 312 to oscillate in with a frequency substantially equal to an average frequency of the primary lateral contour vibration mode of the resonator elements. Mechanical vibration of the resonator elements may generate an output signal modulated by the RF input signal and at a frequency equal to an absolute value of the difference between the RF carrier wave frequency and the reference signal frequency. The output signal is fed through the first bias node and RF transmission line 306 to the input node of the low pass filter 308. The high pass filter 304 is configured to block the output signal from the RF antenna 302. The output signal containing the RF input signal is passed by the low pass filter 308 to the input of the low noise amplifier 310.

Those skilled in the art to which the invention relates will appreciate that modifications may be made to the described example embodiments and other embodiments realized within the scope of the claimed invention.

What is claimed is:
1. A micro electro-mechanical system (MEMS) mixer-filter, comprising:
 a substrate;
 a first plurality of direct current (DC) bias lines formed of electrically conductive material, attached to said substrate;
 a second plurality of DC bias lines formed of electrically conductive material, attached to said substrate;
 a multiplicity of primary supports on a top surface of said substrate, each said primary support including an electrically conductive element connected to exactly one of said DC bias lines; and
 a multiplicity of resonator elements on said primary supports, configured such that there is one resonator element per primary support and one primary support per resonator element, in which:

said resonator elements are MEMS resonator elements;
said resonator elements are configured in a rectangularly tiled array, in which each of said resonator elements in an interior of said array is adjacent to four other of said resonator elements;
said resonator elements are uniform in size and shape;
a length of said resonator elements is between 5 and 50 microns;
a width of said resonator elements is between 5 and 50 microns;
a thickness of said resonator elements is between 100 nanometers and 100 microns;
adjacent said resonator elements are separated by gaps between 100 nanometers and 10 microns;
said resonator elements are substantially coplanar, so that top surfaces of adjacent said resonator elements are aligned within 10 percent of said thickness of said resonator elements;
said resonator elements are formed of solid material;
an outer surface of said resonator elements is electrically conductive with a resistivity less than 100 ohm-cm, each said conductive outer surface being electrically connected to said electrically conductive element of said primary support under said resonator element having said outer surface;
alternating resonator elements in each row and each column of said array are electrically connected to said first plurality of said DC bias lines through said electrically conductive element of said primary supports; and
alternating resonator elements in each row and each column of said array which are not electrically connected to said first plurality of DC bias lines are electrically connected to said second plurality of DC bias lines through said electrically conductive element of said primary supports.

2. The mixer-filter of claim 1, in which there are at least 10,000 said resonator elements in said rectangularly tiled array.

3. The mixer-filter of claim 2, in which:
an average frequency of primary lateral contour vibration modes of said resonator elements is between 50 MHz and 500 MHz; and
an impedance of said mixer-filter at said average frequency of said primary lateral contour vibration modes is less than 2 kohms.

4. The mixer-filter of claim 1, in which said primary supports are attached to centers of bottom surfaces of said resonator elements.

5. The mixer-filter of claim 1, in which:
said resonator elements are between 200 and 500 nanometers thick; and
said resonator elements are separated by gaps between 100 and 500 nanometers wide.

6. The mixer-filter of claim 1, in which:
said resonator elements are between 1 and 5 microns thick; and
said resonator elements are separated by gaps between 500 nanometers and 2 microns wide.

7. The mixer-filter of claim 1, in which:
said resonator elements are between 20 and 100 microns thick; and
said resonator elements are separated by gaps between 1 and 10 microns wide.

8. The mixer-filter of claim 1, in which said resonator elements include material selected from the group consisting of:
aluminum,
nickel,
copper,
polysilicon, and
single crystal silicon.

9. The mixer-filter of claim 1, in which an average frequency of primary lateral contour vibration modes of said resonator elements is between 50 megahertz (MHz) and 500 MHz.

10. The mixer-filter of claim 1, in which said primary supports include material selected from the group consisting of:
aluminum,
nickel,
copper,
polysilicon, and
single crystal silicon.

11. A process of forming a MEMS mixer-filter, comprising steps:
providing a substrate;
forming a first plurality of direct current (DC) bias lines of electrically conductive material, so that said first plurality of DC bias lines is attached to said substrate;
forming a second plurality of DC bias lines of electrically conductive material, so that said second plurality of DC bias lines is attached to said substrate;
forming at least 1000 primary supports on a top surface of said substrate, by a process including a step of forming an electrically conductive element of each of said primary supports, so that said electrically conductive element is connected to exactly one of said DC bias lines; and
forming at least 1000 resonator elements on said primary supports, configured such that there is one resonator element per primary support and one primary support per resonator element, so that:
said resonator elements are separated from the top surface of the substrate by a gap to form MEMS resonator elements;
said resonator elements are configured in a rectangularly tiled array, in which each of said resonator elements in an interior of said array is adjacent to four other of said resonator elements;
said resonator elements are uniform in size and shape;
a length of said resonator elements is between 5 and 50 microns;
a width of said resonator elements is between 5 and 50 microns;
a thickness of said resonator elements is between 100 nanometers and 100 microns;
adjacent said resonator elements are separated by gaps between 100 nanometers and 10 microns;
said resonator elements are substantially coplanar, so that top surfaces of adjacent said resonator elements are aligned within 10 percent of said thickness of said resonator elements;
said resonator elements are formed of solid material;
an outer surface of said resonator elements is electrically conductive with a resistivity less than 100 ohm-cm, each said conductive outer surface being electrically connected to said electrically conductive element of said primary support under said resonator element having said outer surface;
alternating resonator elements in each row and each column of said array are electrically connected to said first plurality of said DC bias lines through said electrically conductive element of said primary supports; and alternating resonator elements in each row and each column of said array which are not electrically connected to said first plurality of DC bias lines are electrically connected to said second plurality of DC bias lines through said electrically conductive element of said primary supports.

12. The process of claim 11, in which there are at least 10,000 said resonator elements in said rectangularly tiled array.

13. The process of claim 12, in which:
an average frequency of primary lateral contour vibration modes of said resonator elements is between 50 MHz and 500 MHz; and
an impedance of said mixer-filter at said frequency of said average primary lateral contour vibration mode is less than 2 kohms.

14. The process of claim 11, in which said primary supports are attached to centers of bottom surfaces of said resonator elements.

15. The process of claim 11, in which:
said resonator elements are between 200 and 500 nanometers thick; and
said resonator elements are separated by gaps between 100 and 500 nanometers wide.

16. The process of claim 11, in which:
said resonator elements are between 1 and 5 microns thick; and
said resonator elements are separated by gaps between 500 nanometers and 2 microns wide.

17. The process of claim 11, in which:
said resonator elements are between 20 and 100 microns thick; and
said resonator elements are separated by gaps between 1 and 10 microns wide.

18. The process of claim 11, in which said resonator elements include material selected from the group consisting of:
aluminum,
nickel,
copper,
polysilicon, and
single crystal silicon.

19. The process of claim 11, in which an average frequency of primary lateral contour vibration modes of said resonator elements is between 50 MHz and 500 MHz.

20. The process of claim 11, in which said primary supports include material selected from the group consisting of:
aluminum,
nickel,
copper,
polysilicon, and
single crystal silicon.

21. A micro electro-mechanical system (MEMS) mixer-filter, comprising:
a substrate;
a first plurality of direct current (DC) bias lines formed of electrically conductive material, attached to said substrate;
a second plurality of DC bias lines formed of electrically conductive material, attached to said substrate;
a multiplicity of primary supports on a top surface of said substrate, each said primary support including an electrically conductive element connected to exactly one of said DC bias lines; and
a multiplicity of MEMS resonator elements on said primary supports, configured such that there is one MEMS resonator element per primary support and one primary support per MEMS resonator element, in which:
said MEMS resonator elements are configured in a rectangularly tiled array, in which each of said MEMS resonator elements in an interior of said array is adjacent to four other of said MEMS resonator elements;
an outer surface of said MEMS resonator elements is electrically conductive, each said conductive outer surface being electrically connected to said electrically conductive element of said primary support under said MEMS resonator element having said outer surface;
alternating MEMS resonator elements in each row and each column of said array are electrically connected to said first plurality of said DC bias lines through said electrically conductive element of said primary supports; and
alternating MEMS resonator elements in each row and each column of said array which are not electrically connected to said first plurality of DC bias lines are electrically connected to said second plurality of DC bias lines through said electrically conductive element of said primary supports.

* * * * *